United States Patent
Yao et al.

(10) Patent No.: US 7,102,188 B1
(45) Date of Patent: Sep. 5, 2006

(54) HIGH RELIABILITY ELECTRICALLY ERASABLE AND PROGRAMMABLE READ-ONLY MEMORY (EEPROM)

(75) Inventors: Thierry Coffi Hervé Yao, Oudenaarde (BE); Greg Scott, Inkom, ID (US); Pierre André Claude Gassot, Lille (FR); Philip John Cacharelis, Oudenaarde (BE)

(73) Assignee: AMI Semiconductor, Inc., Pocatello, ID (US)

( * ) Notice: Subject to any disclaimer, the term of this patent is extended or adjusted under 35 U.S.C. 154(b) by 0 days.

(21) Appl. No.: 11/098,940

(22) Filed: Apr. 5, 2005

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/300; 257/318; 257/390; 257/E27.016; 257/E27.071

(58) Field of Classification Search ............ 257/300, 257/318, 390
See application file for complete search history.

(56) References Cited

U.S. PATENT DOCUMENTS

| | | | |
|---|---|---|---|
| 4,924,278 A | 5/1990 | Logie .................. 357/23.5 |
| 5,465,231 A | 11/1995 | Ohsaki ................. 365/185.33 |
| 5,929,478 A | 7/1999 | Parris et al. ............. 257/314 |
| 6,100,560 A | 8/2000 | Lovett ................... 257/315 |
| 6,141,238 A * | 10/2000 | Forbes et al. ............. 365/145 |
| 2004/0070020 A1* | 4/2004 | Fujiwara et al. ........... 257/314 |
| 2004/0071008 A1* | 4/2004 | Chen et al. .............. 365/145 |
| 2004/0212005 A1* | 10/2004 | Lojek .................... 257/315 |

OTHER PUBLICATIONS

An Experimental 5-V-Only 256-kbit CMOS EEPROM with a High-Performance Single -Polysilicon Cell Jun-Ichi Miyamoto, Jun-Ichi Tsujimoto, Naohiro Matsukawa, Shigeru Morita, Kazuyoshi Shinada, Hiroshi Nozawa, & Tetsuya Iizuka IEEE Journal of Solid—State Circuits, vol. SC-21, No. 5, Oct. 1986 p. 852-860.

"Thickness Scaling Limitation Factors of ONO Interpoly Dielectric for Nonvolatile Memory Devices" Seiichi Mori, Yoshiko Yamaguchi Araki, Muneharu Sato, Hisataka Meguro, Hiroaki Tsunoda, Eiji Kamiya, Kuniyoshi Yoshi Yoshikawa, Norihisa Arai and Eiji Sakagami IEEE Transactions on Electron Devices, vol. 43, No. 1, Jan. 1996 p. 47-53.

"Theoretical and Experimental Investigation of Si Nanocrystal Memory Device With HfO2 High-k Tunneling Dielectric" Jong Jin Lee, Xuguang Wang, Weiping Bai, Nan Lu, and Dim-Lee Kwong IEEE Transactions on Electron Devices, vol. 50, No. 10, Oct. 2003 p. 2067-2072.

(Continued)

*Primary Examiner*—Ngân V. Ngô
(74) *Attorney, Agent, or Firm*—Workman Nydegger

(57) ABSTRACT

An EEPROM cell that combines a FET transistor and a capacitor. The transistor has a well that is shared by potentially all of the EEPROM cells in the array thereby reducing size. A gate terminal is formed over the well. Source and drain terminals are formed in the well. The well is isolated from the gate terminal using a dielectric layer. A first terminal of the capacitor is connected to the gate terminal using a dielectric layer. A first terminal of the capacitor is connected to the gate terminal, and may be oppositely doped from the gate terminal to improve retention. The second terminal is formed by a second well that is underneath the first terminal and isolated from the first terminal. The capacitance may be increased without area increase by forming a metal layer over the first terminal and separated from the first terminal by a thick dielectric layer, and connected to the second well via a conductive via.

41 Claims, 8 Drawing Sheets

OTHER PUBLICATIONS

"Impact of Crystal Size and Tunnel Dielectric on Semiconductor Nanocrystal Memory Performance" Min She and Tsu-Jae King IEEE Transactions on Electron Devices, vol. 50, No. 9, Sep. 2003 p. 1934-1940.

"Twin MONOS Cell with Dual Control Gates" Yutaka Hayashi, Seiki Ogura, Tomoya Saito, Tomoko Ogura 2000 Symposium on VLSI Technology Digest of Tecnical Papers 2000 IEEE.

"A Flash EEPROM Cell with Self-Aligned Trench Transistor & Isolation Structure" Ken-ichiro Nakagawa, Kazuyoshi Yoshida, Shuichi Masuda, Akira Yoshino and Isami Sakai 2000 Symposium on VLSI Technology Digest of Tecnical Papers 2000 IEEE.

"Reliably Implications in Advanced Embedded Two-Transistor-Fowler-Nordheim-NOR Flash Memory Devices" A. Scarpa, G. Tao, J. Dijkstra , F.G. Kuper Solid-State Electronics p. 1765-1773.

* cited by examiner

HIGH RELIABILITY ELECTRICALLY ERASABLE AND PROGRAMMABLE READ-ONLY MEMORY (EEPROM)

BACKGROUND OF THE INVENTION

1. The Field of the Invention

The present invention relates generally to non-volatile semiconductor memory devices and, more particularly, to an Electrically Erasable Programmable Read Only Memory (EEPROM).

2. Background and Relevant Art

Electronic circuitry has contributed enormously to the advancement of civilization. One of the fundamental building blocks of electronic circuitry is memory. Memory is generally characterized as being volatile or non-volatile. Volatile memory does not retain data between power cycles and requires constant power in order to retain data. Non-volatile memory retains data persistently even across numerous power cycles.

Electrically Erasable and Programmable Read-Only-Memory (EEPROM) is one type of non-volatile memory. An EEPROM is an array or a vector of EEPROM cells. The information is stored in the EEPROM cell as an electrical charge. The electrical charge modifies the electrical characteristics of the EEPROM cell so that the information can be later read back using the modified electrical characteristics. The electrical charge is typically blocked in a trapping layer that gives to the EEPROM cell its memory capability. The electrical charge remains blocked in the trapping layer regardless of power fluctuations or cycling thereby giving the EEPROM cell its non-volatile properties.

The trapping layer is often an isolated floating gate. More recent technologies use other trapping layers such as silicon-nitride or nanocrystals. The trapping layer is isolated from the external world by isolating dielectric layers. The dielectric function is primarily to prevent electrical charge loss from the trapping layer, thereby preventing data loss. One dielectric material in common use in EEPROMs is silicon-dioxide ($SiO_2$) of CMOS technologies. Dedicated processes are often used to improve the performance of the $SiO_2$. Others dielectrics, such as the ONO or High-k, have been recently introduced to improve the isolation.

Information storage requires that the electrical charge pass through one or more dielectric layers to or from the trapping layer. There are a number of different mechanisms used to conventionally pass charge through a dielectric layer for this purpose. Fowler-Nordheim Tunneling is one such mechanism that requires almost no power consumption and rather large voltages across the dielectric. Other mechanisms are based on hot-carrier effects and require large power consumptions and medium voltages across the dielectric.

The reliability of any given EEPROM cell is often critical since many applications can tolerate little, if any, data loss. One important reliability topic is the disturb issue. Disturbs are unwanted modifications of the data stored in untargeted EEPROM cells due to wanted actions on targeted EEPROM cells within the same EEPROM array or vector. Another reliability issue is data retention. Trapped charges in the trapping layer tend to leak away even with no action on the EEPROM cell, sometimes resulting in data loss. A low disturb and high retention EEPROM can thus be highly reliable, thereby significantly reducing the development cost, and thereby increasing the number of applications that the EEPROM may support.

EEPROMs generally have complex and expensive technologies and fabrication processes to fulfill the reliability requirements. Some EEPROMs can be processed with reduced complexity if low cost applications are targeted that require small embedded memory capability. One conventional concept for reducing processing complexity is to have the fabrication process as close as possible to the standard Complementary Metal-Oxide-Semiconductor (CMOS) with few or no added custom steps. One drawback of such low cost EEPROMs is that the resulting EEPROM cell may occupy relatively large layout area in the circuit. This is especially true of single-polysilicon EEPROM cells having only a CMOS gate to form the trapping layer.

Accordingly, what would be advantageous is an EEPROM having EEPROM cells that have high reliability, are not expensive to process, that are low power, and that occupy a reduced layout area.

BRIEF SUMMARY OF THE INVENTION

The foregoing problems with the prior state of the art are overcome by the principles of the present invention, which relate to a an Electrically Erasable and Programmable Read-Only-Memory (EEPROM) cell of a first dominant doping type (e.g., N-type or P-type, also referred to herein as "polarity type"). The EEPROM cell is a robust, low power, low cost, and compact EEPROM. The EEPROM cell is robust in that it has reduced disturb effects and high retention, thereby improving the reliability of the EEPROM cell, and reducing the development time and cost of the EEPROM cell. The EEPROM cell is low power due to low current consumption. Having no current consumption has advantages at two levels. Firstly, the cell reliability is better because current consuming mechanisms for data storage are known to degrade the EEPROM cell. Secondly, the circuit blocks that supply the high voltage for data storage can be simpler, more reliable and finally less expensive. The EEPROM cell is low cost due to design and process simplifications and due to layout area efficiencies.

The EEPROM cell includes a combination of a field effect transistor of the same type as the EEPROM cell, and a capacitor coupled to the field effect transistor. As for the field effect transistor, a bulk terminal includes a field effect transistor well of opposite polarity type as the EEPROM cell. The field effect transistor well is shared by potentially all of the EEPROM cells within the EEPROM array. Since the well is shared, an area consuming well strap structure is not needed for every cell, and may be present in only one or only a few EEPROM cells. Accordingly, layout area is preserved.

A gate terminal in the form of a conductive layer is formed over the field effect transistor well. The gate terminal is selectively isolated from the bulk terminal using a dielectric layer disposed between the gate terminal and the well. This dielectric layer is thin enough to allow Fowler-Nordheim tunneling during the application of high voltages between the gate and bulk terminals, but substantially isolates the gate terminal from the bulk terminal during the application of lower voltages.

A source terminal and a drain terminal, each of the same polarity as the EEPROM cell, are disposed within the field effect transistor well. Other structural components may be also be included for even further improved design as will be described in the preferred embodiments of the present invention section below.

The capacitor includes a first terminal and a second terminal. The first terminal is electrically connected to the gate terminal of the field effect transistor. In order to improve data retention and write efficiency, at least a portion of the first terminal may be polysilicon having a different polarity than polysilicon within the gate terminal of the field effect transistor.

The second terminal is formed by a second well of the opposite polarity type as the EEPROM cell. The second well is underneath the first terminal and separated from the first terminal with a second dielectric layer. The capacitor dielectric layer may be fabricated using the same processing steps as used to fabricate the field effect transistor dielectric layer, for cost savings.

A metal layer may overly the first terminal and be connected to the second well through a conductive via formed through a thick dielectric layer. This increases the capacitance of the capacitor with no area cost since the metal layer overlies the first terminal of the capacitor.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
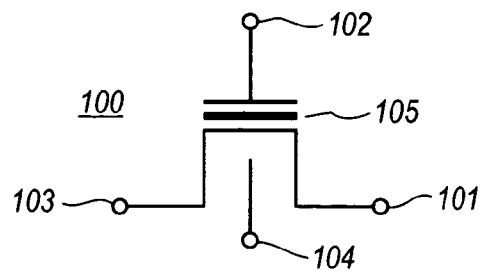
FIG. 1 is a symbol diagram of an EEPROM cell in accordance with the principles of the present invention.

The principles of the present invention relate to a high reliability Electrically Erasable and Programmable Read-Only-Memory (EEPROM) cell that uses low power, and that is potentially low cost. FIG. 1 is a symbol of an EEPROM cell 100 in accordance with the present invention that will be used throughout the remainder of this description. The EEPROM cell 100 is a Field Effect Transistor (FET) having four terminals: a drain terminal 101, a gate terminal 102, a source terminal 103, and a bulk terminal 104 (also referred to herein respectively as "Drain 101", "Gate 102", "Source 103", and "Bulk 104"). The EEPROM cell 100 has a trapping layer 105 (represented by a thick line in FIG. 1) inserted between the Gate 102 and the channel. The Bulk 104 is drivable in that it can be forced to any voltage allowed by the technology. The EEPROM cell 100 may be either N-type or P-type.

Figure 2:
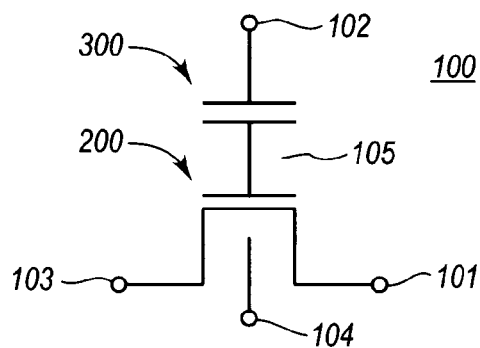
FIG. 2 is a schematic diagram of the EEPROM cell of FIG. 1.

FIG. 2 is a schematic diagram of the EEPROM cell 100. The EEPROM cell 100 is composed of a Field Effect Transistor (FET) 200 and a capacitor 300. The FET transistor 200 may be, for example, a Metal Oxide Semiconductor FET (MOSFET). The drain terminal, source terminal and bulk terminal of the FET transistor 200 form respectively the Drain 101, Source 103 and bulk 104 of the EEPROM cell 100. One terminal of the Capacitor 300 forms the Gate 102 of the EEPROM cell 100. The second terminal of the Capacitor 300 is connected to the gate terminal of the FET 200 forming the trapping layer of the EEPROM cell 100. The trapping layer may also be referred to herein as "Floating-Gate" or "FG" for short.

The EEPROM cell 100 is N-type if the FET 200 is N-type meaning that the drain terminal (i.e., Drain 101), source terminal (i.e., Source 103) and the gate terminal of the FET 200 are N-type and the bulk terminal (i.e., Bulk 104) is P-type. Conversely, the EEPROM cell 100 is P-type if the FET 200 is P-type meaning that the drain terminal (i.e., Drain 101), the source terminal (i.e., Source 103) and the gate terminal of the FET 200 are P-type and the bulk terminal (i.e., Bulk 104) is N-type. A terminal is said to be N-type if its dominant doping species (also referred to herein as "polarity type") are N-type such as Arsenic, Phosphorus, or the like. A terminal is said to be P-type if its dominant doping species are P-type such as Boron, Fluorine, or the like.

The FET 200 may be either a standard component from a library of available technology to reduce the cost of manufacture. However, the FET 200 may alternatively be a custom component. Capacitor 300 may be a Polysilicon-Dielectric-Semiconductor, typically referred to as a MOS (metal-Oxide-Semiconductor) capacitor. To reduce costs, this capacitor 300 may be fabricated using a standard single-polysilicon capacitor already available in many base CMOS processes. As a practical matter, the capacitance of Capacitor 300 is significantly larger (for instance, three times larger) than the capacitance value of the gate terminal of the FET 200 to have a functional EEPROM cell 100.

Further novel features of the structure of the EEPROM cell 100 will become apparent from description further below. For now, however, the basic operation of the EEPROM cell 100 will first be described.

Data is stored in the EEPROM cell 100 by putting an electrical charge in the Floating-Gate 105. This trapped electrical charge shields the voltage of the Gate 102 so that the threshold voltage $V_T$ of the EEPROM cell 100 is modified. The modification of the threshold voltage is seen as a translation of the Drain current $I_D$ versus Gate voltage $V_G$ characteristics of the EEPROM cell 100.

Figure 3:
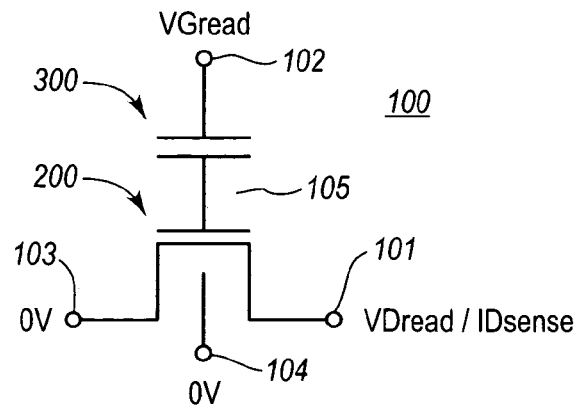
FIG. 3 illustrates the EEPROM cell of FIG. 2 during a Read operation.

FIG. 3 shows a possible read configuration of the EEPROM cell 100. Gate 102 is biased to the Gate-Read-Voltage VGread, while the Drain 101 is biased to the Drain-Read-Voltage VDread. A resulting drain current IDsense is sensed out. The sign of VGread and VDread depend on whether the EEPROM cell 100 is N-type or P-type. As a practical matter, both voltages VGread and VDread are tuned so that a minimum drain current (for instance, $10^{-6}$ Ampères) is sensed at the Drain 101 of an EEPROM cell 100 when no charge is present in the Floating-Gate 105.

The sense current IDsense depends on the charge stored in the Floating-Gate 105. If the EEPROM cell 100 is N-type, IDsense is larger for more positive charge trapped in the Floating-Gate 105. If the EEPROM cell 100 is P-type, IDsense is smaller for more positive charge trapped in the Floating Gate 105. Therefore, the state of the EEPROM cell 100 may be determined based on the sense current IDsense.

The EEPROM cell 100 is not limited to storing a single bit of data. The EEROM cell 100 can store analog data, multi-bit data or fraction-bit data. The data stored in the EEPROM cell 100 is said to be "analog" if the sense current IDsense is linked by a non-discrete function to the analog information. The EEPROM cell 100 is said to be "multi-bit" if the stored data is linked by a discrete function to the sense current IDsense sensed at the cell during the read operation. For example, the sense current IDsense should be in one of $2^N$ ranges to code N bits. A single bit cell is a particular case of the multi-bit cell in which two states (or ranges) are defined (N=1) according to the amplitude of the sensed information. For instance, if IDsense is larger than a threshold current, the EEPROM cell is in one state of the bit. Otherwise, the EEPROM cell is in the other state. The EEPROM cell 100 is said to be "fraction-bit" if more than one cell is used to code one bit. This is generally the case if redundancy is used. For example, two EEPROM cells 100 may be used to code one bit, and the state of the bit may be determined by the cell the delivers the larger IDsense.

The data storage is performed by mean of Fowler-Nordheim Tunneling (FNT) through the gate dielectric of the FET 200 of the EEPROM cell 100. Data storage using Fowler-Nordheim Tunneling permits the EEPROM cell 100 to consume low power. A functional EEPROM 100 requires two opposite operations; namely, erase (hereinafter also "Erase") and write (hereinafter also "Write"). The Erase operation makes IDsense larger while the Write operation makes IDsense smaller.

Figure 4:
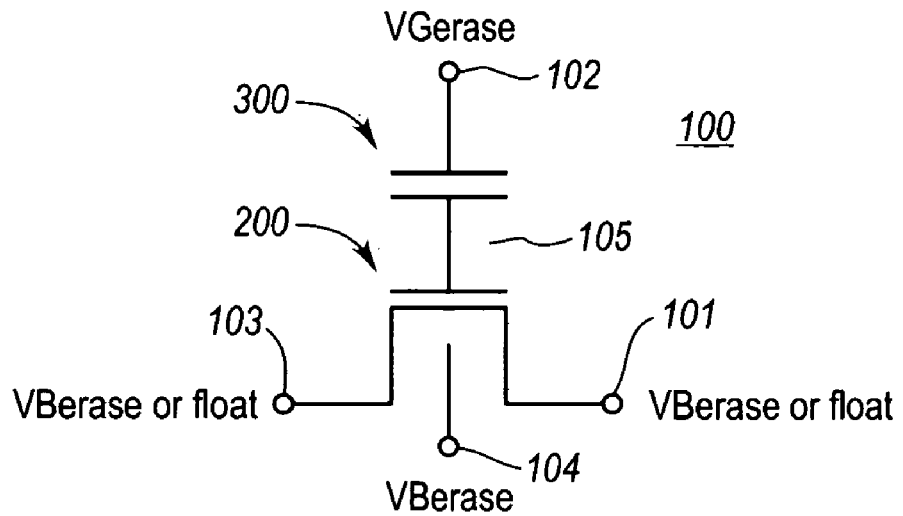
FIG. 4 illustrates the EEPROM cell of FIG. 2 during an Erase operation.

FIG. 4 shows the operating conditions of the Erase operation. The Erase operation is performed by putting the FET 200 in the accumulation regime. The accumulation regime is the condition of the FET 200 where the Bulk 104 is not depleted at its interface with the gate dielectric. Accordingly, the Erase operation uses the Bulk erase approach. If the EEPROM cell 100 is N-type, the accumulation of the FET 200 is achieved by forcing the Gate 102 to an Erase-Gate-Voltage VGerase lower than the Erase-Bulk-Voltage VBerase forced at the Bulk 104. If the EEPROM cell 100 is P-type, VGerase is higher than VBerase to form the accumulation. The Fowler-Nordheim Tunneling is efficient only if the absolute value of this voltage difference (i.e., |VGerase-VBerase|) is sufficiently large (for instance, 12 volts) given the properties of the gate dielectric of the FET 200, given the capacitance configuration of the EEPROM cell 100, and given the duration of the Erase operation. The Erase operation is further configured by having the Drain 101 and the Source 103 floating or biased to VBerase.

Figure 5:
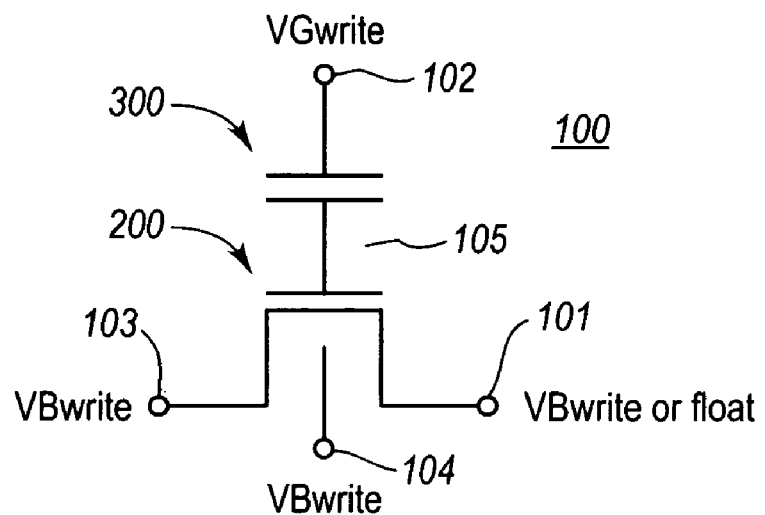
FIG. 5 illustrates the EEPROM cell of FIG. 2 during a Write operation.

FIG. 5 shows the operating conditions of the Write operation. The Write operation is performed by putting the FET 200 in the inversion regime. The inversion regime is the condition of the FET 200 where the Bulk 104 is depleted at its interface with the gate dielectric and a conductive channel is formed shorting the Drain 101 to the Source 103. Accordingly, the Write operation uses the Channel write approach. If the EEPROM cell 100 is N-type, the inversion of the FET 200 is achieved by forcing the Gate 102 to a Write-Gate-Voltage VGwrite that is higher than the Write-Bulk-Voltage VBwrite forced at the Bulk 104. If the EEPROM cell 100 is P-type, VGerase is smaller than VBerase to obtain the inversion. Once again, the Fowler Nordheim Tunneling is efficient only if the absolute value of the voltage difference (i.e., |VGwrite-VBwrite|) is large enough (for instance, 12 volts) given the properties of the gate dielectric of the FET 200, given the capacitance configuration of the EEPROM cell 100, and given the duration of the Write operation. The Write operation is further configured by having the Drain 101 and the Source 103 biased to VBwrite. It is also possible to float one of the Drain 101 or Source 103, given that they are shorted in the inversion regime.

It will be understood to one of ordinary skill in the art having read this description that the use of arbitrary Write and Erase voltages is meant to show the flexibility of the EEPROM cell 100. This simplifies the design of the circuit blocks generating and routing the high voltages to the EEPROM cell 100. In practice, it may be more simple to have the Erase-Gate-Voltage voltage equal to the Write-Bulk-Voltage (i.e., VGerase=VBwrite) and the Write-Gate-Voltage equal to the Erase-Bulk-Voltage (i.e., VGwrite=VBerase).

Figure 6:
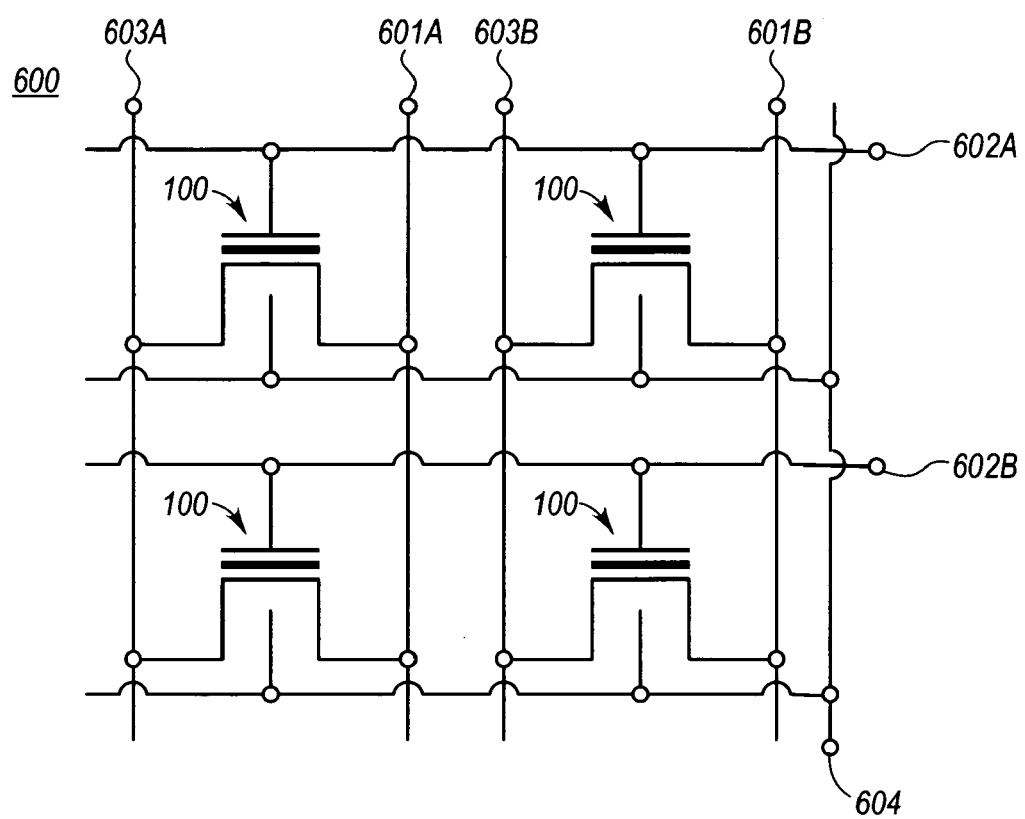
FIG. 6 illustrates a first example of an EEPROM array incorporating a two-dimensional array of EEPROM cells of FIG. 2.

Having described an EEPROM cell in accordance with the principles of the present invention, example EEPROM array configurations will now be described. FIG. 6 shows an example of such a configuration in the form of EEPROM array 600. Although EEPROM array 600 is illustrated for the sake of clarity and simplicity as being a 2-by-2 EEPROM cell array of EEPROM cells 100, the principles of the present invention may be extended to any size EEPROM vector or array.

The EEPROM array 600 is organized in rows and columns. Each column has two vertical lines representing a bit line and a source line. For example, the left-most column has two vertical lines referred to herein as bit line 601A and source line 603A. Furthermore, the right-most column has two vertical lines referred to herein as bit line 601B and source line 603B. The bit lines 601A and 601B may collectively be referred to herein as "bit lines 601". Either of the bit lines 601A and 601B may collectively be referred to as "bit line 601". The source lines 603A and 603B may collectively be referred to herein as "source lines 603". Either of the source lines 603A and 603B may also be referred to as "source line 603". A row is also referred to herein as a "page". Each page has a horizontal line that represents a program line. For example, the upper page includes program line 602A, while the lower page includes program line 602B. The program lines 602A and 602B may collectively be referred to herein as "program lines 602".

Also, either of the program lines 602A and 602B may also be referred to as "program line 602". The full array has an additional terminal which is the Bulk 604.

All EEPROM cells 100 from the same column have their Drain 101 and their Source 103 respectively connected the corresponding bit line and source line. All EEPROM cells 100 from the same page have their Gate 102 connected to the corresponding program line for that page. All the EEPROM cells 100 of the EEPROM array 600 have their Bulk 104 connected to the Bulk terminal 604.

Data storage in the EEPROM array 600 may be performed by first performing the Erase operation of the selected page, followed by a write operation on the selected EEPROM cells within the page.

The Erase of a selected page is performed by applying the Erase configuration, as explained above, to all the EEPROM cells 100 of the selected page. Therefore, the Bulk 604 in biased to VBerase, the bit lines 601 and source lines 603 can be either floating or biased to VBerase, and the program line 602 of the selected page must be biased to VGerase. The unselected pages use a "no-Erase" configuration that is the same as the Erase configuration except that the corresponding program line 602 is biased to VBerase (or close to VBerase), instead of VGerase, so that the Gate-to-Bulk voltage is zero volts (or close to zero volts) such that no Fowler Nordheim Tunneling is triggered. If the Gate-to-Bulk voltage is zero, there is no voltage stress and so there is little (if any) disturb resulting from the Erase operation.

The Write of a selected EEPROM cell 100 within a selected page is performed by applying the Write configuration, as explained above, to the selected EEPROM cell(s). In that case, the Bulk 604 is biased to VBwrite, the bit line 601 and source line 603 corresponding to the selected column of the selected cell are biased to VBwrite, given that one of the Source 103 or Drain 101 can be floating. Additionally, the program line 602 of the selected page is biased to VGwrite. The unselected pages use a "no-Write" configuration that consists in forcing the program line 602 of the unselected page to VBwrite (or close to VBwrite), instead of VGwrite, so that the Gate-to-Bulk voltage is once again zero volts (or close to zero volts) and no Fowler Nordheim Tunneling is triggered. If the Gate-to-Bulk voltage is zero, there is no voltage stress and so little (if any) disturb resulting from the Write operation.

Also during a Write operation, the unselected EEPROM cells from selected pages use a "Write-inhibit" configuration which consists in biasing the bit line 601 and the source line 603 of each of the unselected EEPROM cells to VDinhib, which is between VBwrite and VGwrite. Once again, one of the two terminals, Source 103 or Drain 101, can be floating. The EEPROM cells 100 having the Write-inhibit configuration have their channel biased to VDinhib so that the Gate-to-channel voltage is reduced, thereby avoiding triggering of Fowler Nordheim Tunneling. The voltage difference (i.e., |VDinhib—VBwrite|) should be large enough (for instance, 4 volts) to prevent significant Fowler Nordheim Tunneling.

The Read operation is not described here as it may be perform in several ways, non being relevant to the principles of the present invention.

Figure 7:
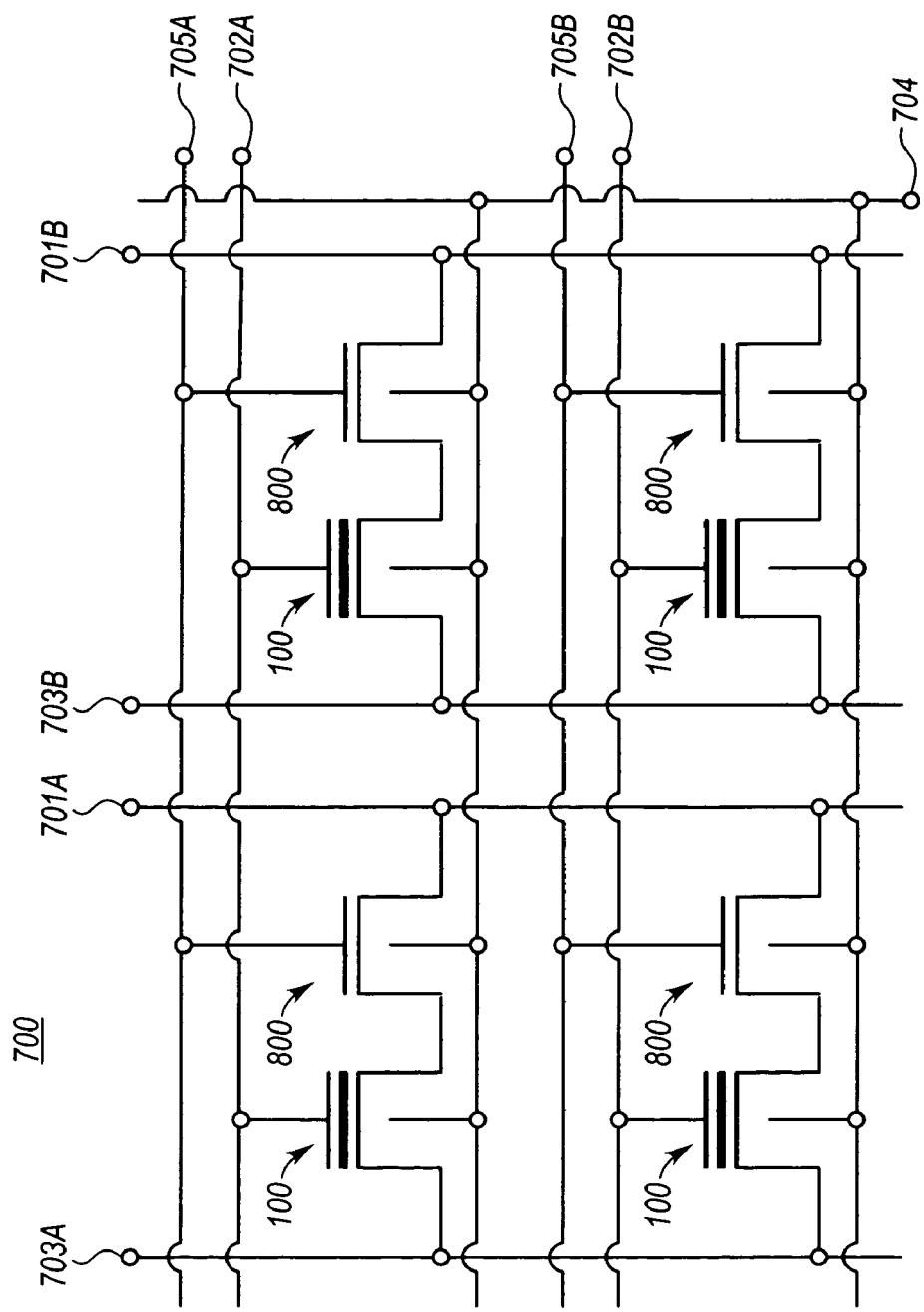
FIG. 7 illustrates a second example of an EEPROM array incorporating a two-dimensional array of EEPROM cells of FIG. 2, and where each EEPROM cell further has a corresponding select transistor.

FIG. 7 shows a second example of an EEPROM array that may incorporate EEPROM cells 100. The array is illustrated as EEPROM array 700. Once again, the EEPROM array 700 is illustrated for the sake of clarity and simplicity as being a 2-by-2 EEPROM cell array, although the described array may extend to an array or vector of any size.

Figure 8:
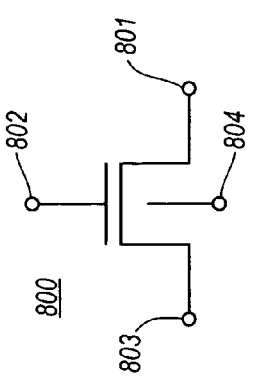
FIG. 8 illustrates a select transistor suitable for the select transistors of FIG. 7.

Each cell of the EEPROM array 700 consists of a small circuit that includes one EEPROM cell 100 and one FET 800. The FET 800 performs as a select transistor. FIG. 8 illustrates the select transistor 800 in isolation. The select transistor 800 is of the same type (e.g., N-type or P-type) as the EEPROM cell 100. The Source 803 of the select transistor 800 is connected to the Drain 101 of the EEPROM cell 100. The Bulk 804 of the select transistor 800 is connected to the Bulk 104 of the EEPROM cell 100. The EEPROM array 700 of FIG. 7 is organized like the EEPROM array 600 of FIG. 6 described above, except that the bit lines 701 connect the Drains 801 of the select-transistors from the same columns. In addition, for each page, there is an additional horizontal line that represents a word line. For example, the upper page includes word line 705A, and the lower page includes word line 705B, which may collectively be referred to as "word lines 705". Either word line 705A or 705B may also be referred to as "word line 705". The word line 705 corresponding to a given page connects all the gates 802 of all select transistors in the page. The program lines are numbered 702A and 702B; the source lines are numbered 703A and 703B. The select transistor in each EEPROM cell increases the reliability of the EEPROM array 700 and reduces the complexity of the EEPROM driving circuitry.

The functionality of the EEPROM array 700 of FIG. 7 is similar to the EEPROM array 600, except that the word lines 705 are additionally managed during each operation. The Read operation is not described here because it could be performed by several ways, none being relevant for the present invention. Regardless of how the Read operational is performed, the voltages applied to the word lines 705 during the Read operation are chosen so that the select transistors 800 of the selected page are turned on while the ones of the unselected pages are turned off.

The select transistor 800 plays no role during the Write and Erase operations. Accordingly, the word line voltage is chosen to protect the integrity of the select-transistors 800. Thus, the voltage applied to the word lines 705 are VBerase (or close to VBerase) during the Erase operation, and to VBwrite (or close to VBwrite) during the Write operation.

FIG. 9 is a cross-sectional view of a processed EEPROM cell 900, which represents one embodiment of the EEPROM cell 100 of FIG. 1. The elements of FIG. 9 will be labeled as though the EEPROM cell 900 is the EEPROM cell 100, although this need not be the case. For example, the EEPROM cell 900 is illustrated in cross-section as including FET 200 and capacitor 300 as described above for FIG. 2.

Figure 9A:
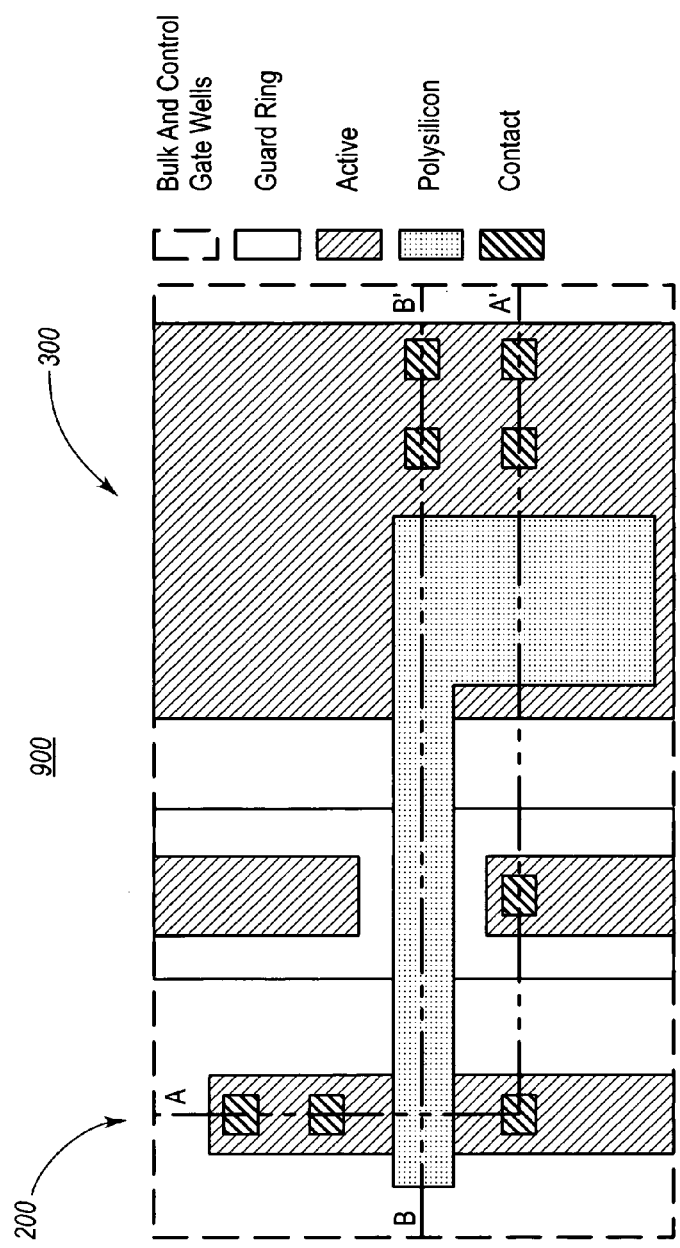
FIG. 9A is a limited top-view showing certain layers of an example processed EEPROM cell of FIG. 2, and is used to explain the cross-sectional views of FIGS. 9B and 9C.
Figure 9B:
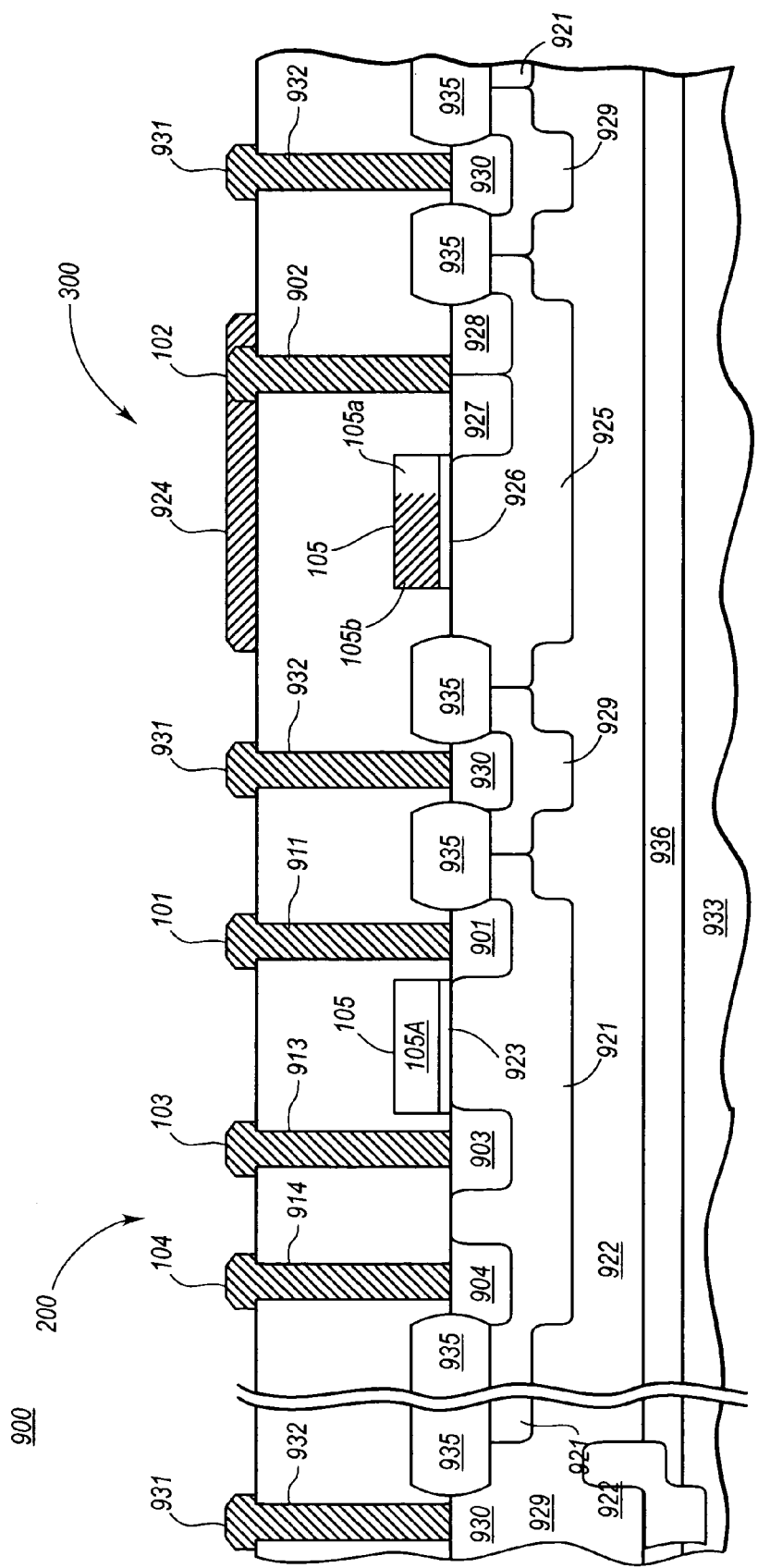
FIG. 9B is a first cross-sectional diagram of the processed EEPROM cell following along the bent cross-section AA' of FIG. 9A.
Figure 9C:
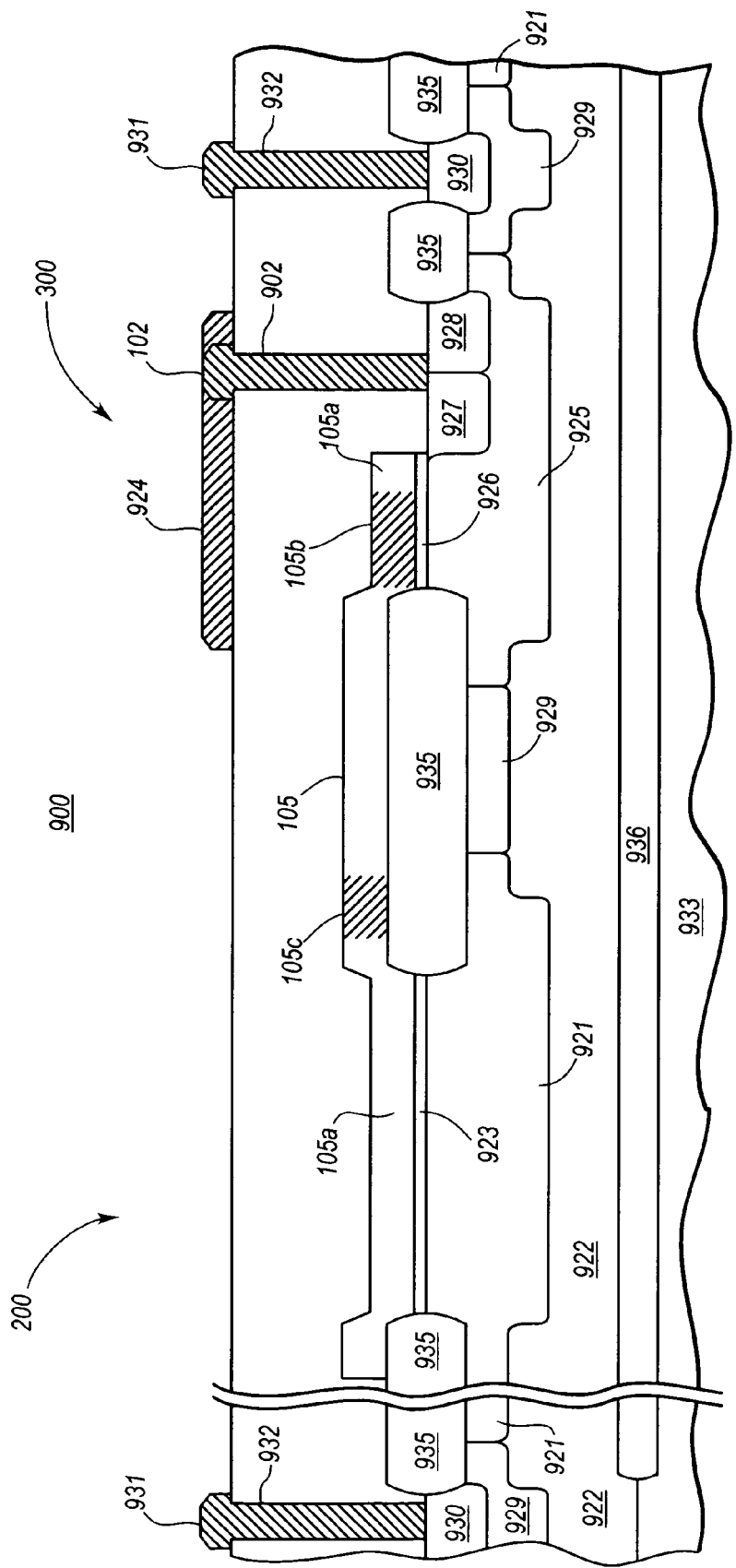
FIG. 9C is a second cross-sectional diagram of the processed EEPROM cell following along the cross-section BB' of FIG. 9A.

FIG. 9A is a top-view of an example processed EEPROM cell 900 that is in accordance with the EEPROM cell 100 of FIG. 2. FIG. 9B is a first cross-sectional diagram of the processed EEPROM cell following along the bent cross-section AA' of FIG. 9A. FIG. 9C is a second cross-sectional diagram of the processed EEPROM cell following along the cross-section BB' of FIG. 9A. In each of FIGS. 9A, 9B, and 9C, the general proximity of the FET is referenced with element number 200, while the general proximity of the capacitor is referenced with element 300, in conformance with the use of this same element numbering in FIGS. 2, 3, 4 and 5.

Referring to FIG. 9B, FET 200 has its Drain 101, Source 103 and Bulk 104. FET 200 has its gate floating forming the Floating-Gate 105. Drain 101, Source 103 and Bulk 104 are respectively connected to a diffused drain 901 by contact 911, a diffused source 903 by contact 913, and a diffused bulk strap 904 by contact 914. Diffused bulk 904 is a strap to the well 921 forming the bulk of FET 200. If the EEPROM 100 is N-type, diffused drain 901 and diffused source 903 are heavily doped, for instance, with an implant dose of 5E15 atoms/cm$^2$, using N-type species such as Arsenic, and the diffused bulk strap 904 and well 921 are doped with P-type species such as Boron (the bulk strap 904 being heavily doped). If the EEPROM cell 100 is P-type, diffused drain 901 and diffused source 903 are heavily doped using P-type species such as Boron, and the diffused bulk strap 904 and well 921 are doped with N-type species such as Arsenic (the bulk strap 904 being heavily doped). The well 921 is ideally common to all FETs 200 of the EEPROM array as shown in FIGS. 6 and 7. This would reduce layout area of the EEPROM array, since the bulk strap 904 would then not be present in many, if not all but one of the EEPROM cells.

Well 921 may be a standard well of CMOS technology so as to reduce development and fabrication costs. However, well 921 might alternatively be custom to improve or tune the electrical properties of the EEPROM cell 100. By reducing the doping concentration of the well 921, the breakdown voltage of its junction with the pocket 922 will increase as will be discussed further below. This might also be achieved by grading the junction of the well 921 with the pocket 922. Moreover, reducing the doping concentration at the surface of well 921 reduces the absolute value of the threshold voltage of FET 200, thereby tuning the threshold voltage window of the EEPROM cell 100 so that the same drain current can be delivered with a smaller gate voltage in the Read operation. Thus, the gate stress voltage is reduced, thereby reducing any disturb due to the Read operation. Reducing the doping concentration of the well 921 may be done, for instance, by protecting the well 921 from the dedicated threshold voltage adjust implantation of the CMOS technology.

The gate terminal of the FET 200 forming the Floating-Gate 105 is isolated from the well 921 by dielectric layer 923. To keep fabrication costs low, the dielectric layer 923 may be the standard gate oxide of the CMOS technology. Nevertheless, for reliability purposes, this dielectric layer 923 may also be dedicated such as, for example, a dedicated silicon-dioxide layer or High-k dielectric layer.

Capacitor 300 may be a Metal-Polysilicon-Dielectric-Silicon sandwich capacitor as shown. One plate of capacitor 300 is the Floating-Gate 105 formed by the polysilicon gate. The other plate of capacitor 300 is the metal plate 924 and the well 925 if the capacitor is in the accumulation regime, or the channel formed at the interface of the silicon well 925 and the capacitor dielectric 926 if the capacitor 300 is in the inversion regime. The regime of capacitor 300 depends on its voltage configuration.

The metal plate 924, the well 925, and the channel formed at the interface of the silicon well 925 and the capacitor dielectric 926 are controlled by the Gate 102 of the EEPROM cell 100 via the contact 902 connected to the diffused source 927 and the well strap 928. If the EEPROM cell 100 is N-type, the diffused source 927 is heavily doped, for instance, with an implant dose of 5E15 atomes/cm$^2$, using N-type species such as Arsenic, and the diffused well strap 928 and well 925 are doped with P-type species such as Boron (the diffused well strap 928 being heavily doped). If the EEPROM cell 100 is P-type, diffused source 927 is heavily doped using P-type species such as Boron, and the diffused well strap 928 and well 925 are doped with N-type species such as Arsenic (the diffused well strap 928 being heavily doped).

The metal plate 924 increases the capacitance of the capacitor 300 with no area cost due to its overlap with the polysilicon gate 105, to thereby reduce the cell size. The well 925 and the metal plate 924 are common to all capacitors 300 from the same page of the EEPROM array when the array is configured as shown in either of FIGS. 6 or 7. Therefore, there is no need for a diffused well strap 928 for each capacitor 300, thereby further reducing the cell area.

The type of the dielectric layer 926 is not critical. However, to reduce fabrication costs, the dielectric layer 926 may be fabricated from the same layer as dielectric layer 923.

The Floating-Gate 105 may be a polysilicon layer heavily doped with the same species types (N-type or P-type) as the EEPROM cell 100 at regions 105a in FIG. 9. Specifically, if the EEPROM cell 100 is N-type, the region 105a is doped N-type. If the EEPROM cell 100 is P-type, the region 105a is doped P-type.

Region 105b of the polysilicon floating gate may be heavily doped with the opposite species types (P-type or N-type) than the EEPROM 100. Specifically, region 105b is part of capacitor 300 and contributes to better retention when the EEPROM cell 100 is N-type. The region 105b also contributes to improved write efficiency.

Figure 10A:
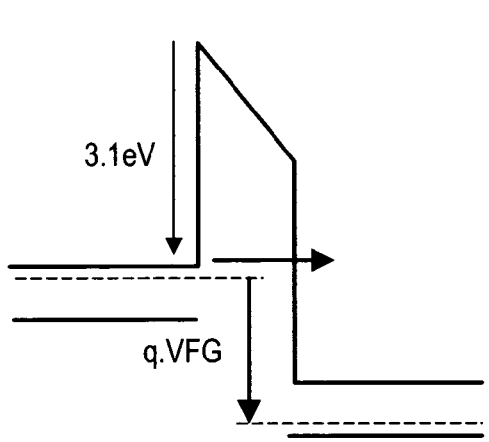
FIGS. 10A through 10D are band diagrams of various polarity type polysilicon gates over various polarity type MOS well structures.
Figure 10B:
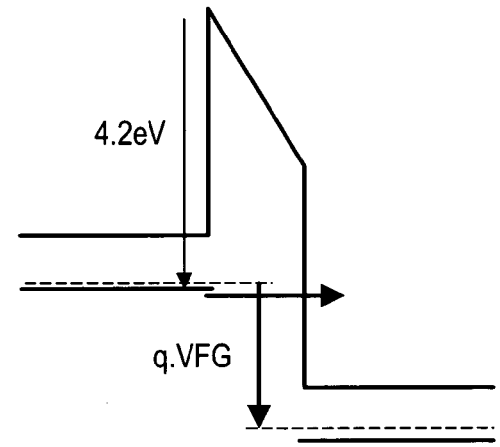
Figure 10C:
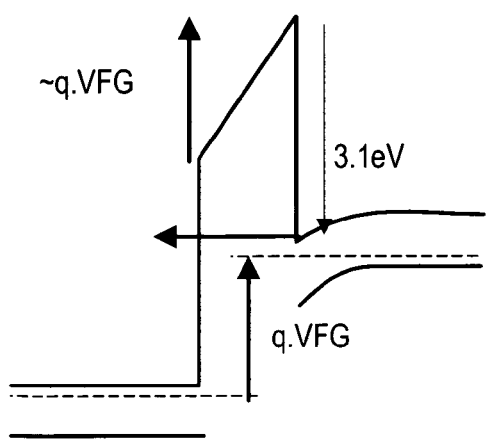
Figure 10D:
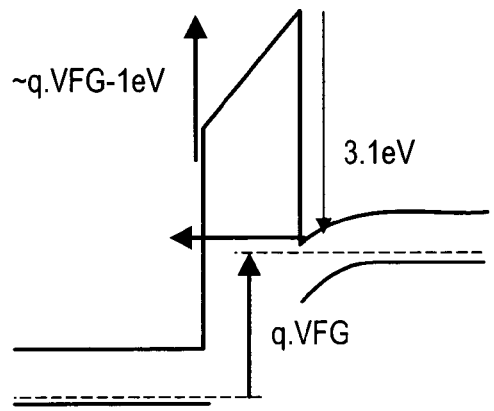

FIGS. 10A through 10D are band diagrams demonstrating the better retention of P-type polysilicon on P-type well MOS structures. FIGS. 10A and 10C represent example band diagrams for N-type polysilicon on P-type well MOS structures. FIGS. 10B and 10D represent example band diagrams for P-type polysilicon on P-type well MOS structures. FIGS. 10A and 10B show electron leakage from the floating gate to the P-type well (arrow pointing to the right). FIGS. 10C and 10D show electron leakage from the P-type well to the floating gate (arrow pointing to the left).

In case of P-type polysilicon, there are few, if any, electrons in the conduction band so that electrons primarily only leak from the valence band of the polysilicon, translating into a higher potential barrier of the dielectric layer. For example, compare the high potential barrier of FIG. 10B versus the lower potential barrier of FIG. 10A. Moreover, in case of electron leakage from the P-type well (see FIGS. 10C and 10D), there is a lower voltage drop across the dielectric layer viewing FIG. 10D (representing P-type polysilicon on a P-type well) as compared to FIG. 10C (representing N-type polysilicon on a P-type well). Therefore, P-type polysilicon on P-type well results in lower leakage current.

The better write efficiency is due to a shift of approximately one volt (upwards if an N-type EEPROM cell, and downwards if a P-type EEPROM cell) of the capacitance versus voltage characteristic of the MOS capacitor of capacitor 300. This results in the accumulation regime of the capacitor 300 beginning around zero volts. Given that the MOS capacitor 300 mainly moves toward the accumulation regime during a Write operation, the accumulation regime is reached earlier under the region 105b, meaning that the capacitance of the capacitor 300 is maximized earlier and longer. Therefore, capacitor 300 is improved without further area consumption.

Well 925 may be fabricated with the same process steps as were used to fabricate well 921 to thereby reduce fabrication costs. The Write and Erase efficiency can be improved by having a low doping concentration at the surface of well 925. As for the Well 921, a low doping concentration at the surface of well 925 will allow a reduced threshold voltage of the MOS capacitor 300 so that the capacitance drop region (which is between the flat band voltage and the threshold voltage) is reduced. Therefore, the effective capacitance of the capacitor 300 is further increased without area consumption.

The well 921 of FET 200 and the well 925 of the capacitor 300 are located in a lightly doped pocket 922 which is doped, for instance, with 5E15 atomes/cm$^3$ of the opposite type than the wells 921 and 925. Pocket 922 may be, for example, an epitaxial layer or a deep implanted well. The pocket 922 is N-type if the EEPROM cell 100 is N-type, and P-type if the EEPROM cell 100 is P-type. The pocket 922 allows the wells 921 and 925 to float, so that both are drivable.

Wells 921 and 925 are electrically isolated meaning that there is some spacing between both. FIG. 9B shows a possible approach to isolate the wells 921 and 925 by inserting a guard-ring around them. The guard-ring is basically fabricated with a well 929 and a well strap 930. The well 929 and the well strap 930 are of the same type (N-type or P-type) as the pocket 922, the well strap 930 being heavily doped. An additional terminal 931 may be used to control the voltage of the pocket 922. The terminal 931 is connected to the pocket 922 via the contacts 932. The terminal 931 is suitable to provide isolation in the embodiment of FIG. 9, although not required. Other isolation techniques, such as Silicon-On-Isolator (SOI), may require no such additional terminal.

The voltage applied to terminal 931 is such that no leakage current is generated at the junction of wells 921 and 925. Pocket 922 may be fabricated on a semiconductor substrate 933. If the pocket 923 and the substrate 922 are of different polarity (N-type or P-type), a buried implant layer 936 may be provided with heavy doping of the same doping type (N-type or P-type) as the pocket 922. The field-oxide 935 separates the active regions of the FET 200 with the capacitor 300 either in the same EEPROM cell or of a neighboring EEPROM cell.

FIG. 9C illustrates the second cross-section of the example processed EEPROM cell with the same elements being labeled with the same element numbering as done for FIG. 9B. The cross-section of FIG. 9C shows the Floating-Gate 105 laying over the active region of the FET 200 formed by the oxide 923 and the well 921, the active region of the capacitor 300 formed by the oxide 926 and the well 925, and the field-oxide 935 separating the active regions of the FET 200 and the capacitor 300.

The region 105c of the Floating-Gate 105 (located on the field-oxide 935 above the well 921) may be implanted with an opposite doping type as the region 105a, and the same doping type as region 105b. This locally increases the threshold voltage of the parasitic field MOS transistor formed by the wells 929 and 921, the diffused Source region 903 and/or Drain 901, the field-oxide 935 and the Floating-Gate 105. Increasing this threshold voltage will reduce parasitic current, thereby increasing the reliability of the EEPROM cell 100.

Accordingly, EEPROM cells and corresponding EEPROM arrays have been described in which there is reduced EEPROM cell size, that may be fabricated at low cost, and that have high reliability. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

The invention claimed is:

1. An Electrically Erasable and Programmable Read-Only-Memory (EEPROM) cell of a first polarity type comprising the following:
   a field effect transistor of the first polarity type comprising:
      a bulk terminal comprising a first well of a second polarity type opposite the first polarity type, wherein the first well is shared by a first plurality of other EEPROM cells;
      a gate terminal comprising a conductive layer formed over the first well;
      a first dielectric layer disposed between the gate terminal and the first well, wherein the first dielectric layer is a tunneling dielectric layer;
      a source terminal of the first polarity type disposed within the first well; and
      a drain terminal of the first polarity type disposed within the first well; and
   a capacitor comprising:
      a first terminal electrically connected to the gate terminal of the field effect transistor;
      a second terminal comprising a second well of the second polarity type underneath the first terminal, the second well being shared by a second plurality of other EEPROM cells; and
      a second dielectric layer disposed within the first terminal and the second terminal of the capacitor.

2. An EEPROM cell in accordance with claim 1, wherein the first polarity type is N-type, and the second polarity type is P-type.

3. An EEPROM cell in accordance with claim 1, wherein the first polarity type is P-type, and the second polarity type is N-type.

4. An EEPROM cell in accordance with claim 1, wherein the EEPROM cell is disposed within an EEPROM cell array comprising a plurality of rows, wherein the first plurality of other EEPROM cells is all of the other EEPROM cells in the EEPROM cell array, and the second plurality of other EEPROM cells is all of the other EEPROM cells in the same row as the EEPROM cell.

5. An EEPROM cell in accordance with claim 1, wherein the EEPROM cell is fabricated using exclusively CMOS technology.

6. An EEPROM cell in accordance with claim 1, wherein the field effect transistor is fabricated using exclusively CMOS technology.

7. An EEPROM cell in accordance with claim 1, wherein the conductive layer is formed of polysilicon having the first polarity type.

8. An EEPROM cell in accordance with claim 1, wherein the first dielectric layer and the second dielectric layer are formed from the same process steps.

9. An EEPROM cell in accordance with claim 1, wherein the first terminal comprises a polysilicon layer.

10. An EEPROM cell in accordance with claim 9, wherein the polysilicon layer is of the first polarity type.

11. An EEPROM cell in accordance with claim 9, wherein the polysilicon layer is of the second polarity type.

12. An EEPROM cell in accordance with claim 9, wherein the polysilicon layer has a portion of the first polarity type and a portion of the second polarity type.

13. An EEPROM cell in accordance with claim 1, further comprising:
   a metal layer overlying the first terminal; and
   a conductive via electrically connecting the second well to the metal layer.

14. An EEPROM cell in accordance with claim 1, wherein the conductive layer and the first terminal are composed of polysilicon, the EEPROM cell further comprising:
   a polysilicon extension electrically connecting the conductive layer to the first terminal.

15. An EEPROM cell in accordance with claim 14, wherein the polysilicon extension is of the second polarity type at least at some of a portion of the polysilicon extension that overlies the first well.

16. An EEPROM cell in accordance with claim 1, wherein the first well is constructed using CMOS technology.

17. An EEPROM cell in accordance with claim 1, wherein the first well has a lower surface concentration than CMOS technology provides.

18. An EEPROM cell in accordance with claim 1, wherein the second well is constructed using CMOS technology.

19. An EEPROM cell in accordance with claim 1, wherein the second well has a lower surface concentration than CMOS technology provides.

20. An EEPROM cell in accordance with claim 1, wherein the first well and the second well overlie a pocket layer of the first polarity type.

21. An EEPROM cell in accordance with claim 1, wherein the first plurality of other EEPROM cells comprise all of the other EEPROM cells in the same EEPROM array as the EEPROM cell.

22. An EEPROM cell in accordance with claim 21, wherein the second plurality of other EEPROM cells comprise all of the other EEPROM cells in the same word or page as the EEPROM cell.

23. An Electrically Erasable and Programmable Read-Only-Memory (EEPROM) cell of a first polarity type comprising the following:
   a field effect transistor of the first polarity type comprising:
      a bulk terminal comprising a first well of a second polarity type opposite the first polarity type;
      a gate terminal comprising a conductive layer formed over the first well;
      a first dielectric layer disposed between the gate terminal and the first well, wherein the first dielectric layer is a tunneling dielectric layer;
      a source terminal of the first polarity type disposed within the first well; and
      a drain terminal of the first polarity type disposed within the first well; and
   a capacitor comprising:
      a first terminal electrically connected to the gate terminal of the field effect transistor, wherein the first terminal comprises a polysilicon layer that has at least a portion that is of the second polarity type;
      a second terminal comprising a second well of the second polarity type underneath the first terminal, the second well being shared by a plurality of other EEPROM cells; and
      a second dielectric layer disposed within the first terminal and the second terminal of the capacitor.

24. An EEPROM cell in accordance with claim 23, wherein the first polarity type is N-type, and the second polarity type is P-type.

25. An EEPROM cell in accordance with claim 23, wherein the first polarity type is P-type, and the second polarity type is N-type.

26. An EEPROM cell in accordance with claim 23, wherein the EEPROM cell is disposed within an EEPROM cell array comprising a plurality of rows, wherein the plurality of other EEPROM cells is all of the other EEPROM cells in the same row as the EEPROM cell.

27. An EEPROM cell in accordance with claim 23, wherein the conductive layer is formed of polysilicon having the first polarity type.

28. An EEPROM cell in accordance with claim 23, wherein the first dielectric layer and the second dielectric layer are formed from the same process steps.

29. An EEPROM cell in accordance with claim 23, further comprising:
   a metal layer overlying the first terminal; and
   a conductive via electrically connecting the second well to the metal layer.

30. An EEPROM cell in accordance with claim 23, wherein the conductive layer and the first terminal are composed of polysilicon, the EEPROM cell further comprising:
   a polysilicon extension electrically connecting the conductive layer to the first terminal.

31. An EEPROM cell in accordance with claim 30, wherein the polysilicon extension is of the second polarity type at least at some of a portion of the polysilicon extension that overlies the first well.

32. An EEPROM cell in accordance with claim 23, wherein the first well and the second well overlie a pocket layer of the first polarity type.

33. An Electrically Erasable and Programmable Read-Only-Memory (EEPROM) cell of a first polarity type comprising the following:
   a field effect transistor of the first polarity type comprising:
      a bulk terminal comprising a first well of a second polarity type opposite the first polarity type;
      a gate terminal comprising a conductive layer formed over the first well;
      a first dielectric layer disposed between the gate terminal and the first well, wherein the first dielectric layer is a tunneling dielectric layer;
      a source terminal of the first polarity type disposed within the first well; and
      a drain terminal of the first polarity type disposed within the first well; and
   a capacitor comprising:
      a first terminal electrically connected to the gate terminal of the field effect transistor;
      a second terminal comprising a second well of the second polarity type underneath the first terminal, the second well being shared by a plurality of other EEPROM cells, a metal layer overlying the first terminal, and a conductive via electrically connecting the second well to the metal layer; and
      a second dielectric layer disposed within the first terminal and the second terminal of the capacitor.

34. An EEPROM cell in accordance with claim 33, wherein the first polarity type is N-type, and the second polarity type is P-type.

35. An EEPROM cell in accordance with claim 33, wherein the first polarity type is P-type, and the second polarity type is N-type.

36. An EEPROM cell in accordance with claim 33, wherein the EEPROM cell is disposed within an EEPROM cell array comprising a plurality of rows, wherein the plurality of other EEPROM cells is all of the other EEPROM cells in the same row as the EEPROM cell.

37. An EEPROM cell in accordance with claim 33, wherein the conductive layer is formed of polysilicon having the first polarity type.

38. An EEPROM cell in accordance with claim 33, wherein the first dielectric layer and the second dielectric layer are formed from the same process steps.

39. An EEPROM cell in accordance with claim 33, wherein the conductive layer and the first terminal are composed of polysilicon, the EEPROM cell further comprising:
 a polysilicon extension electrically connecting the conductive layer to the first terminal.

40. An EEPROM cell in accordance with claim 39, wherein the polysilicon extension is of the second polarity type at least at some of a portion of the polysilicon extension that overlies the first well.

41. An EEPROM cell in accordance with claim 33, wherein the first well and the second well overlie a pocket layer of the first polarity type.

* * * * *

UNITED STATES PATENT AND TRADEMARK OFFICE
CERTIFICATE OF CORRECTION

PATENT NO. : 7,102,188 B1
APPLICATION NO. : 11/098940
DATED : September 5, 2006
INVENTOR(S) : Yao et al.

It is certified that error appears in the above-identified patent and that said Letters Patent is hereby corrected as shown below:

Page 2
Item 56, Other Publications, Column 1, Line 7, change "Tecnical" to --Technical--
Item 56, Other Publications, Column 2, Line 4, change "Tecnical" to --Technical--
Item 56, Other Publications, Column 2, Line 5, change "Relably" to --Reliability--

Column 2
Line 21, before "an Electrically", remove "a"

Column 4
Line 52, remove "either"

Column 5
Line 45, before "delivers", change "the" to --that--

Column 7
Line 5, change "connected" to --connecting--
Line 17, after "Bulk 104", change "in" to --is--
Line 60, change "non" to --none--

Column 8,
Line 30, after "performed", change "by" to --in--

Signed and Sealed this

Twenty-fourth Day of April, 2007

JON W. DUDAS
*Director of the United States Patent and Trademark Office*